United States Patent [19]

Oakes

[11] Patent Number: 4,715,036

[45] Date of Patent: Dec. 22, 1987

[54] DATA ENCODER SYSTEM

[75] Inventor: Alan E. Oakes, Lexington, Mass.

[73] Assignee: Digital Equipment Corporation, Maynard, Mass.

[21] Appl. No.: 864,588

[22] Filed: May 16, 1986

[51] Int. Cl.$^4$ .............................................. G06F 11/10
[52] U.S. Cl. ........................................................ 371/37
[58] Field of Search .......................... 371/37, 38, 39, 40

[56] References Cited

U.S. PATENT DOCUMENTS 4,394,642 7/1983 Currie ................................ 371/40 X
4,532,629 7/1985 Furuya .................................. 371/38

Primary Examiner—Jerry Smith
Assistant Examiner—Robert W. Beausoliel, Jr.
Attorney, Agent, or Firm—Cesari and McKenna

[57] ABSTRACT

An encoding circuit (10) receives data by way of a bus (12) and stores it in one of two read/write memories (22 and 24). An error-correction-code generator (50) generates codes from groups of the stored words, the members of each group being selected in a complicated fashion. In order to supply the words of the groups to the error-correction-code generator (50) in the proper sequence, a read-only memory (40) contains in successively addressed locations the addresses of the words in the intended sequence. The storage of the address sequence in the read-only memory (40) enables the error-correction coding to be generated in real time with a minimum of complicated addressing hardware.

8 Claims, 2 Drawing Figures

FIG. 1

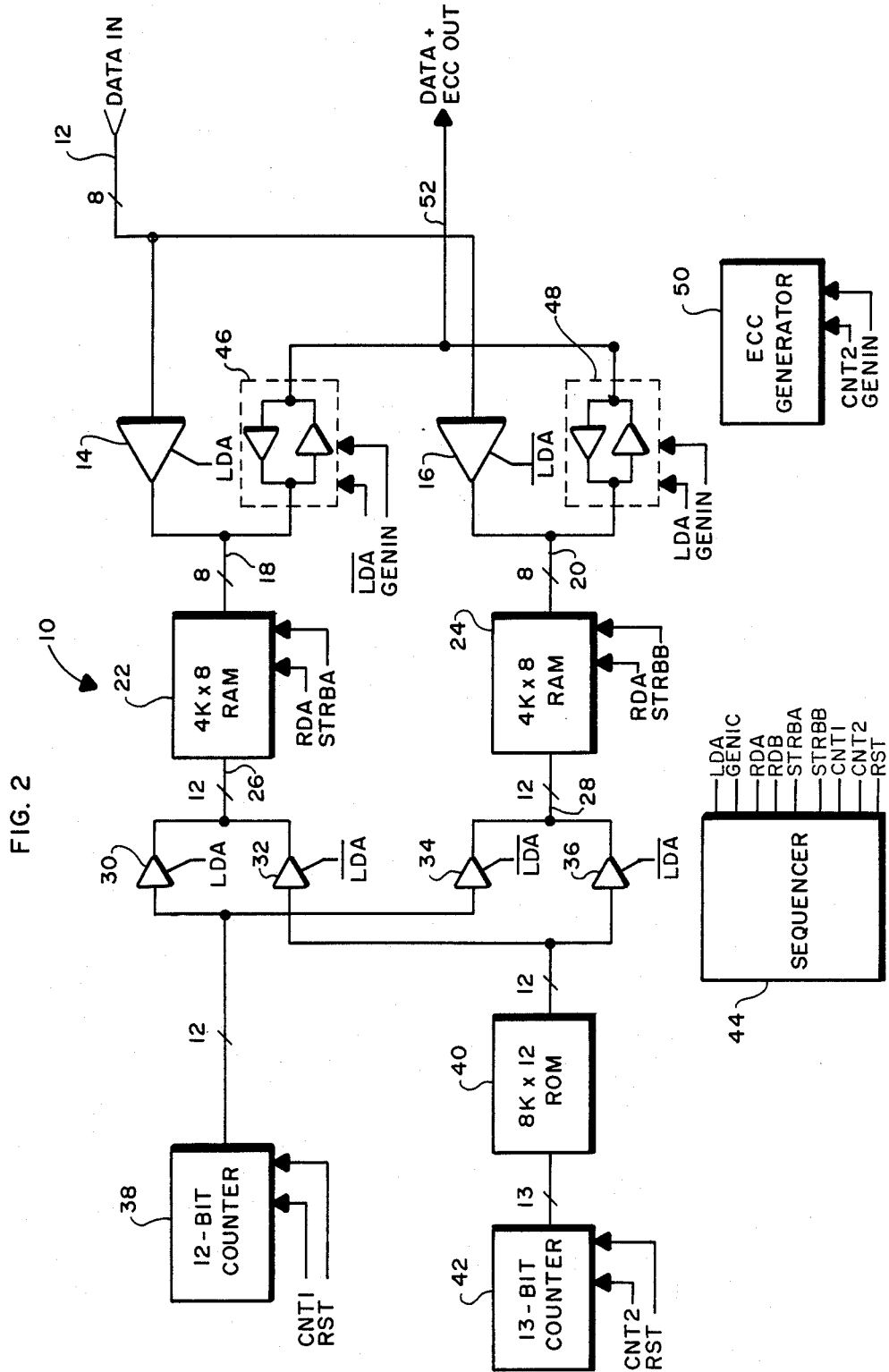

DATA ENCODER SYSTEM

BACKGROUND OF THE INVENTION

The present invention is directed to error-correction-code generation. It is directed particularly to the sequencing of words within a block of data to be encoded in accordance with a complex encoding scheme.

A relatively recent development in the art of phonograph recordings is the so-called compact disc, which stores audio information in digital form. Because of the high density and low cost of this storage medium, the compact disc has been proposed for storing other kinds of data, too. But storage of, say, financial data requires more accuracy than storage of audio information does. The misreading of an occasional bit during playback of audio data is very tolerable; it ordinarily is not even noticed. The same cannot be said of financial data. Thus, in adapting the compact disc to other types of data storage, a greater degree of error-correction coding must be added.

Error-correction-code words typically are generated in operations performed on groups of data words. In one proposed code-generation scheme, these groups are assembled, not from consecutive data words, but from words selected in complex sequences. Because of the complex sequencing, the data handling required in the encoding operation is quite complicated. Even in dedicated circuitry, calculation in real time of the addresses from which successive words must be fetched for processing can push the limits of circuit speed, and the address-calculation circuitry can contribute significantly to the complexity of the total encoding circuit.

It is accordingly an object of the present invention to process the data at the rates at which it ordinarily is received and to employ a minimal amount of hardware to do so.

SUMMARY OF THE INVENTION

According to the present invention, a read-only memory addressed by a simple counter produces a sequence of addresses. These addresses are applied to a memory in which data words have been stored in the order in which they were received, and the words in the locations designated by the read-only-memory output are fetched. The contents of the read-only memory make up the sequence in which the data words are to be processed, so the data thus fetched are supplied to an error-correction-code generator in the proper sequence. The read-only-memory contents also designate the locations in which the resulting ECC words are to be stored. This arrangement eliminates the need for complicated fast-operating computational circuitry for calculating addresses.

BRIEF DESCRIPTION OF THE DRAWINGS

These and further features and advantages of the present invention are described in connection with the accompanying drawings, in which:

FIG. 1 is a diagram illustrating the manner in which the encoding groups are formed from the incoming data; and FIG. 2 is a block diagram of the circuitry for processing an input block of data to produce an output block that includes both data and error-correction coding.

DETAILED DESCRIPTION OF THE PREFERRED EMBODIMENT

The encoding circuitry to be described in connection with FIG. 2 performs its encoding function on a *sector* consisting of 2,076 bytes, to which the circuit 10 of FIG. 2 adds 276 bytes of error-correction coding to result in a total of 2,352 bytes in a block that is to be sent to the recording equipment. (The recording equipment itself provides further encoding, but that further encoding is not germane to the present invention.)

The sector words are stored in 2,076 one-byte locations in a random-access memory. From the words in this sector, the circuitry of FIG. 2 generates two blocks of words, one from the words stored in the even-numbered locations and one from the words stored in the odd-numbered locations.

Figure 1:
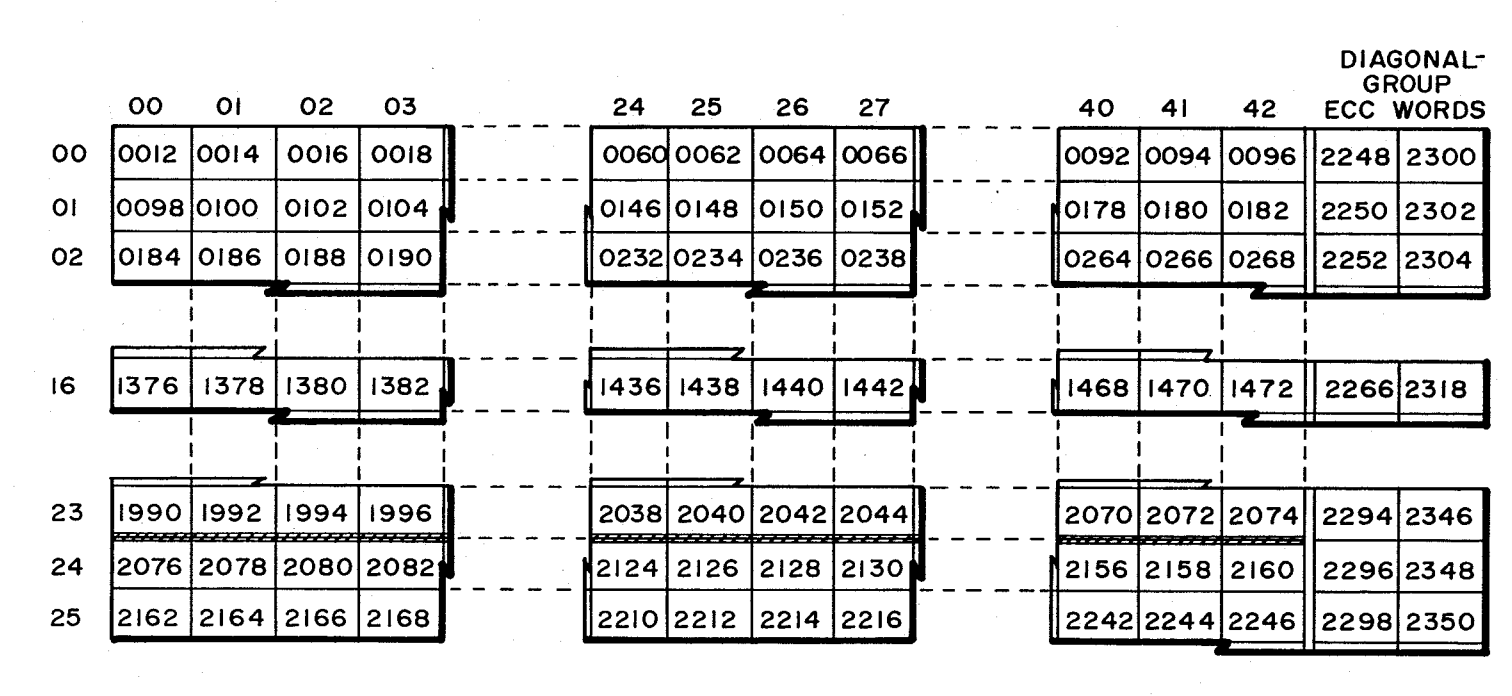

Of the 2,076 received words, the first twelve, i.e., the words in location 0000–0011 (decimal) are synchronization bits, and they do not enter into the generation of error-correction-code words. The remaining words are treated as two arrays, the even array being depicted in FIG. 1.

FIG. 1 shows that the even locations 0012–2074 are treated as an array of 43 rows and 24 columns. An odd array, consisting of the data in odd-numbered locations 0013–2075, is used to generate another set of error-correction codes. To generate the first two error-correction-code words, the contents of the first column—i.e., the contents of the even-numbered locations 0012, 0098, 0184, . . . , 1990—are treated as the coefficients of a polynomial whose coefficients are chosen from the Galois field $GF(2^8)$. This polynomial is divided in an ECC generator by a code-generating polynomial, and the coefficients of the remainder (there are two remainder coefficients) are used as the ECC words. These words are stored in locations 2076 and 2162, which, as will be described later, are thereafter treated as part of the first column. This operation is repeated for each column.

When codes have been calculated and stored for all of the columns of the even array, further ECC words are generated from diagonals of the even array. A first diagonal group consists of the contents of locations 0012, 0100, 0188, . . . , 2124, 2212, 0064, 0152, . . . , 1472. (Note that the diagonal wraps around from the bottom row to the top row to include a member from each column.) In forming these diagonal groups, the ECC words generated from the columns are used as the last words of the respective columns from which they were generated. An ECC generator forms ECC words from the words in the diagonal groups in a manner the same as that in which it generated ECC words from the column groups. Each diagonal group starts in column 00, and there is one diagonal group for each entry in column 00, including the ECC words, so two ECC words are associated with each row, as FIG. 1 indicates. When all the diagonal groups in the even array have been used to generate ECC words, further ECC words are similarly generated from the column and diagonal groups of the odd array.

It can be appreciated that this selection of locations for group members, together with the fact that even and odd arrays are selected from alternate words in the same sector, results in a very complex sequencing of word fetching and storage. Because of this complexity, calculation of the addresses to be used in fetching the words is fairly complicated, and very-high-speed logic circuitry would be needed to perform such calculations in real time—that is, to perform such calculations as fast as a computer can supply them. Furthermore, the amount of hardware required to calculate the addresses could be quite significant.

The circuitry of FIG. 2 avoids these problems. Circuitry 10 receives eight-bit data words sequentially on bus 12, which feeds input bus gates 14 and 16. Gate 14 admits data from bus 12 onto memory bus 18 when a control signal LDA is high. When LDA is low, on the other hand, gate 14 assumes its high-impedance state (tri-state) so that the signals on bus 12 are not passed through to bus 18. A similar gate 16 controls the admission of signals from bus 12 onto a second memory bus 20, but gate 16 is controlled by the complement of LDA, so its operation alternates with that of gate 14.

Buses 18 and 20 carry signals representing eight-bit data words that are applied to or produced by $4K \times 8$ random-access memories 22 and 24, which are addressed by signals on twelve-bit buses 26 and 28, respectively.

The addresses on bus 26 are placed on it by one or the other of address gates 30 and 32. Similar gates 34 and 36 place addresses on bus 28. The LDA signal determines which address gate is to apply address signals to which address bus. Gates 30 and 34 forward signals from a twelve-bit counter 38, while gates 32 and 36 receive their signals from the data output port of an $8K \times 12$ read-only memory 40, whose addresses are produced by a thirteen-bit counter 42. Counters 38 and 42 increment their counts on count signals CNT1 and CNT2, respectively, and are reset by a reset signal RST whenever LDA changes state.

A sequencer 44 generates the various control signals described so far and additionally generates RDA ("read RAM A") and STRBA ("strobe RAM A") to control read/write memory 22. If RDA is low, an edge of the STRBA signal causes memory 22 to store, in a location designated by the signals on bus 26, the data represented by the signals on bus 18. If RDA is high, memory 22 places the contents of the addressed location onto bus 18. Memory 24 is operated similarly in response to RDB and STRBB signals, which also are generated by the sequencer 44.

When memories 22 and 24 are read—i.e., when they place data signals on their respective data buses 18 and 20, those signals are forwarded by ECC/output gates 46 and 48 to an ECC generator 50 and an output bus 52. Gates 46 and 48 are bi-directional; they can also forward the output of ECC generator 50 to the respective memories 22 and 24. They are enabled and disabled in accordance with the state of LDA, and a direction signal GENIN specifies the directions in which they will forward signals when they are enabled.

In operation, a sector of data words—i.e., the data to be stored on one sector of the compact disc—appears sequentially on input bus 12, and the sequencer 44 initially sets LDA high so that gate 14 admits the signals to memory bus 18 while gate 16 prevents those signals from appearing on bus 20. In synchronism with the receipt of data words on input bus 12, count signals CNT1 are applied to the twelve-bit counter 38, and enabled gate 30 forwards these signals to the address port of memory 22. STRBA strobes strobe RAM 22 in synchronism with the counter signals and the input words while RDA is high, so successively received input words are stored in successive locations in RAM 22.

When an entire sector of data words has been received, the RST Signal resets counter 38, and LDA assumes its low state. The next sector received over bus 12 is then loaded into memory 24 in a manner the same as that in which the first sector was loaded into memory 22.

Concurrently with the loading of the second sector into memory 24, ECC words are generated for the first-sector data, which are now stored in memory 22. Specifically, the thirteen-bit counter 42 is reset at the same time as the twelve-bit counter 38 is, but it counts at a rate considerably higher than that at which counter 38 does. The contents of the locations that its output signals sequentially designate in read-only memory 40 begin with 0012, which is the location of the first even-array element, and progress to 0098, 0184, . . . , 1990 to cause memory 22 to place signals on bus 18 representing the contents of the first column of the even array.

The sequencer 44 applies GENIN to direct bi-directional gate 46 to apply the output of memory 22 to the ECC generator 50. The GENIN signal also causes the ECC generator 50 to accept data, and the CNT2 signal, which is the same as the signal that increments counter 42, steps the received data through the stages of the ECC generator 50. The ECC generator 50 thereby performs the polynomial division required for generation of the ECC words.

When the last word in an array column has been sent to the ECC generator—e.g., when the contents of location 1990 have been read out—the sequencer 44 changes the state of the GENIN signal, causing the ECC generator 50 to accept no more data but rather to apply the contents of its final stage to the input port of bi-directional gate 46. Since GENIN has changed state, bi-directional gate 46 forwards these signals to the data port of memory 22. The RDA signal is changed with the GENIN signal, so the data represented by these signals are stored in the location designated by the output of the read-only memory. For the first column, this location is 2076, the address to which the first ECC word for the first row of the even array is to be stored. On the next CNT2 signal, the ECC generator 50 places its second ECC word on its output port, and this word is stored in location 2162, whose address is contained in the next RAM location. The storage locations for the ECC words are chosen in accordance with the order in which they are required in the output data stream; the block of data and ECC words are output from circuit 10 in the order of their addresses in memories 22 and 24.

After ECC words are generated from the column groups, ECC words are generated from the diagonal groups in a similar fashion. Specifically, address 0012 is contained in the ROM location that follows the location containing 2246 so that the first word in the first diagonal is fetched after the second ECC word for the last column is stored. The next locations in read-only memory 40 contain 0100, 0188, . . . , 2124, 2212, 0064, 0152, . . . , 1472. The sequencer then changes the state of GENIN so that the first ECC-generator output word is stored in the location, namely location 2248, whose address is next fetched from read-only memory 40. The next output of read-only memory 40 is the address of the location into which the second ECC word generated from the first diagonal is to be stored, and the ROM output after that is 0098, the address of the first word in the second diagonal group of the even array. This process continues until ECC words have been generated from all of the diagonals and stored in appropriate locations in memory 22.

ECC words are then generated and stored for the column and diagonal groups of the odd array. ECC generation both for the even and for the odd arrays of the first data sector takes place concurrently with storage of second-sector data in memory 24, as does subsequent transmission of the resultant contents of memory 22 to the recording equipment. Specifically, the sequencer 44 operates memory 22 and gate 46 to cause words to be read from memory 22 and placed on output bus 52. Again, the contents of read-only memory 40 designate the memory addresses so that the data are read out in the order expected by the recording equipment. In this case, that order is merely the order of the RAM addresses, i.e., 0000, 0001, . . . , 2351.

When this operation is completed, and when the second-sector data are completely stored in memory 24, the counters 38 and 42 are reset, and third-sector data from bus 12 are again directed to memory 22. This time, error-correction-code words are generated from the second-sector data of memory 24.

It will be appreciated that this arrangement constitutes a particularly advantageous scheme for generating the error-correction codes from groups selected in a complex manner. The sequence with which the words are to be used is simply stored in a read-only memory, and calculation of the sequence does not have to be performed in real time. Therefore, the need for complicated calculating circuitry is avoided, as is the time penalty that calculation would impose on the operation. This arrangement thus constitutes a significant advance in the art.

What is claimed as new and desired to be secured by Letters Patent of the United States is:

1. An encoding device for implementing an encoding scheme in which an error-correction-code (ECC) generator is employed to generate from a sector of sequentially received data words an output block comprising the data words and ECC words generated from groups of data words within the sector, the encoding scheme including a processing order in which the sequence of data words in at least some of the groups is different from the sequence in which the words are received so that the data words must be applied to the ECC generator in a processing sequence that is different from the sequence in which the data words are received, the encoding device comprising:

A. a device input port for receiving device input signals representing successive data words in a sector of data words for which error-correction coding is to be generated;

B. a data memory having a plurality of data-memory locations and adapted for application of address signals and data signals thereto, the data memory being operable to store in data-memory locations designated by address signals applied thereto data represented by data signals applied thereto and to produce a data-memory output representing the data stored in the data-memory locations designated by address signals applied thereto;

C. input means for operating the data memory, by application of address signals thereto and by application of the device input signals as data signals thereto, to store in the data memory the data words represented by the device input signals;

D. an ECC generator, having a generator input port and a generator output port, for receiving at the generator input port a generator input representing a succession of data words and for producing at the generator output port a generator output representing ECC words generated from groups of the data words represented by the generator input;

E. generator input means for applying the data-memory output to the generator input port during predetermined ECC-generation time periods for generation of ECC words therefrom;

F. generator output means for applying the generator output as data signals to the data memory during predetermined ECC-storage time periods to store in the data memory the ECC words represented by the generator output;

G. a device output port;

H. device output means for applying to the device output port, during predetermined output time periods, the data-memory output;

I. a counter for producing a counter output representing periodically incremented count values; and J. an address memory, including a plurality of address-memory locations and connected to receive the counter output as address-memory address signals, for generating address-memory outputs representing the contents of address-memory locations specified by address-memory address signals applied thereto, the address memory containing in successive address-memory locations designated by the counter output during the ECC-generation time periods the addresses of successive words in the processing sequence and containing in the address-memory locations designated by the counter output during the ECC-storage time periods the addresses of locations in the data memory into which ECC words are to be stored, whereby the address memory specifies the processing order of the encoding scheme;

K. address-application means for applying the address-memory outputs to the data memory as data-memory address signals; and L. output-address means for operating the data memory by application of a sequence of address signals thereto during the predetermined output time periods to produce a data-memory output representing an output block comprising the data words and ECC words generated therefrom in accordance with the encoding scheme, whereby the output means applies to the output port signals representing an output blockgenerated in accordance with the encoding scheme.

2. An encoding device as defined in claim 1 wherein:

A. the output-address means includes the address memory; and

B. the address contains in the address-memory locations designated by the counter output during the ECC-storage time periods the addresses of locations in the data memory containing the words of the output block in the sequence in which they are to be produced at the output port in accordance with the encoding scheme.

3. An encoding device as defined in claim 2 wherein the input means includes a counter, separate from said first-mentioned counter, for generating, as the address signals produced by the input means, a succession of counter signals representing addresses in numerical order.

4. An encoding device as defined in claim 1 wherein the input means includes a counter, separate from said first-mentioned counter, for generating, as the address signals produced by the input means, a succession of counter signals representing addresses in numerical order.

5. An encoding device as defined in claim 1 wherein:
   A. the encoding device includes a second data memory separate from the first-mentioned data memory, having a plurality of data-memory locations, and adapted for application of address signals and data signals thereto, the second data memory being operable to store, in data-memory locations designated by address signals applied thereto, data represented by data signals applied thereto and to produce a second-data-memory output representing the data stored in the data-memory locations designated by address signals applied thereto;
   B. the input means divides the data received at the device input port into first and second second sector groups, every other received sector being assigned to the first sector group and the remaining sectors being assigned to the second sector, the input means operating the first data memory during reception of sectors of the first group and operating the second data memory during reception of sectors of the second group, whereby sectors of the first and second groups are stored in the first and second data memories, respectively;
   C. the generator input means applies the first-data-memory output to the generator input port during those predetermined ECC-generation time periods that occur during reception of sectors of the second sector group and applies the second-data-memory output to the generator input port during those predetermined ECC-generation time periods that occur during reception of sectors of the first sector group;
   D. the generator output means applies the generator output as data signals to the first data memory during those predetermined ECC-storage time periods that occur during reception of sectors of the second sector group and applies the generator output as data signals to the second data memory during those predetermined ECC-storage time periods that occur during reception of sectors of the first sector group;
   E. the device output means applies the first-data-memory output to the device output port during those predetermined output time periods that occur during reception of sectors of the second sector group and applies the second-data-memory output to the device output port during those predetermined output time periods that occur during reception of sectors of the first sector group;
   F. the address-application means applies the address-memory outputs to the first data memory as data-memory address signals during reception of sectors of the second sector group and applies the address-memory outputs to the second data memory as data-memory address signals during reception of sectors of the first sector group; and
   G. the output-address means operates the first data memory during those predetermined output time periods that occur during reception of sectors of the second sector group and operates the second data memory during those predetermined output time periods that occur during reception of sectors of the first sector group;

whereby the sector currently being received is stored while the previously received sector is processed and the results transmitted.

6. An encoding device as defined in claim 5 wherein:
   A. the output-address means includes the address memory; and
   B. the address contains in the address-memory locations designated by the counter output during the ECC-storage time periods the addresses of locations in the data memory containing the words of the output block in the sequence in which they are to be produced at the output port in accordance with the encoding scheme.

7. An encoding device as defined in claim 6 wherein the input means includes a counter, separate from said first-mentioned counter, for generating, as the address signals produced by the input means, a succession of counter signals representing addresses in numerical order.

8. An encoding device as defined in claim 5 wherein the input means includes a counter, separate from said first-mentioned counter, for generating, as the address signals produced by the input means, a succession of counter signals representing addresses in numerical order.

* * * * *